United States Patent
Chen et al.

(10) Patent No.: US 12,230,193 B2
(45) Date of Patent: Feb. 18, 2025

(54) LIGHT-EMITTING DEVICE

(71) Applicant: Innolux Corporation, Miaoli County (TW)

(72) Inventors: Chung-Le Chen, Miaoli County (TW); Shuo-Ting Hong, Miaoli County (TW); Ting-Yao Chu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 35 days.

(21) Appl. No.: 18/354,624

(22) Filed: Jul. 18, 2023

(65) Prior Publication Data

US 2024/0062711 A1 Feb. 22, 2024

(30) Foreign Application Priority Data

Aug. 18, 2022 (CN) .......................... 202210992261.0

(51) Int. Cl.
*H01L 27/02* (2006.01)
*G09G 3/32* (2016.01)

(52) U.S. Cl.
CPC .......... *G09G 3/32* (2013.01); *H01L 27/0248* (2013.01); *G09G 2300/0819* (2013.01); *G09G 2300/0861* (2013.01); *G09G 2320/0233* (2013.01)

(58) Field of Classification Search
CPC ............. G09G 3/32; G09G 2300/0819; G09G 2300/0861; G09G 2320/0233; G09G 2300/0842; G09G 2320/0214; G09G 2330/04; G09G 2330/06; G09G 3/3233; H01L 27/0248; H05B 45/50; H05B 47/24; H02H 9/042

See application file for complete search history.

(56) References Cited

U.S. PATENT DOCUMENTS

| 2015/0379927 A1* | 12/2015 | Cai | G09G 3/006 345/76 |
|---|---|---|---|
| 2021/0225209 A1* | 7/2021 | Wang | G09F 9/301 |
| 2023/0217595 A1* | 7/2023 | Tsai | H05K 1/181 361/760 |

FOREIGN PATENT DOCUMENTS

| CN | 107993579 | 5/2018 |
|---|---|---|
| CN | 115731824 | 3/2023 |

* cited by examiner

*Primary Examiner* — Andrew Sasinowski
(74) *Attorney, Agent, or Firm* — JCIPRNET

(57) ABSTRACT

A light-emitting device is provided. The light-emitting device includes a data input circuit, a driving transistor, a light-emitting component, a storage capacitor, and an electrostatic protection circuit. The driving transistor has a control terminal and a first terminal. The light-emitting component is coupled to the first terminal of the driving transistor. The storage capacitor is coupled between the data input circuit and the control terminal of the driving transistor. The electrostatic protection circuit is coupled to a node between the data input circuit and the storage capacitor. The light-emitting device of the disclosure can reduce electrostatic discharge generated by the storage capacitor to reduce the risk of the light-emitting device being damaged by static electricity.

20 Claims, 6 Drawing Sheets

LIGHT-EMITTING DEVICE

CROSS-REFERENCE TO RELATED APPLICATION

This application claims the priority benefit of China application serial no. 202210992261.0, filed on Aug. 18, 2022. The entirety of the above-mentioned patent application is hereby incorporated by reference herein and made a part of this specification.

BACKGROUND

Technical Field

The disclosure relates to an electronic device, and more particularly to a light-emitting device.

Description of Related Art

The conventional light-emitting device (for example, a display apparatus, a light source, or a pixel circuit) uses a signal to drive a light-emitting component, so that the light-emitting component provides an output light. However, during the operation or the manufacturing process of the light-emitting device, electrostatic discharge (ESD) of the storage capacitor of the light-emitting device may damage the transistors adjacent to the capacitor in the light-emitting device. When the transistors adjacent to the storage capacitor are damaged, the threshold voltage value of the transistors changes and the hump effect occurs. The hump effect causes abnormal switching operations of the transistors or operations in subcritical regions, resulting in the issue of non-uniform brightness of the light-emitting device. As such, it can be seen that how to reduce the electrostatic discharge generated by the capacitor of the light-emitting device is one of the research focuses of persons skilled in the art.

SUMMARY

The disclosure provides a light-emitting device that can reduce electrostatic discharge generated by a capacitor of the light-emitting device.

According to an embodiment of the disclosure, the light-emitting device includes a data input circuit, a driving transistor, a light-emitting component, a storage capacitor, and an electrostatic protection circuit. The driving transistor has a control terminal and a first terminal. The light-emitting component is coupled to the first terminal of the driving transistor. The storage capacitor is coupled between the data input circuit and the control terminal of the driving transistor. The electrostatic protection circuit is coupled to a node between the data input circuit and the storage capacitor.

Based on the above, the electrostatic protection circuit is coupled to the node between the data input circuit and the storage capacitor. The electrostatic protection circuit can prevent the light-emitting device from being damaged by static electricity during the manufacturing process. The risk of damage to the transistors adjacent to the storage capacitor by the electrostatic discharge is reduced. In this way, the hump effect is reduced, so that the light-emitting device can maintain good brightness uniformity and stability.

DETAILED DESCRIPTION OF DISCLOSED EMBODIMENTS

Figure 1:
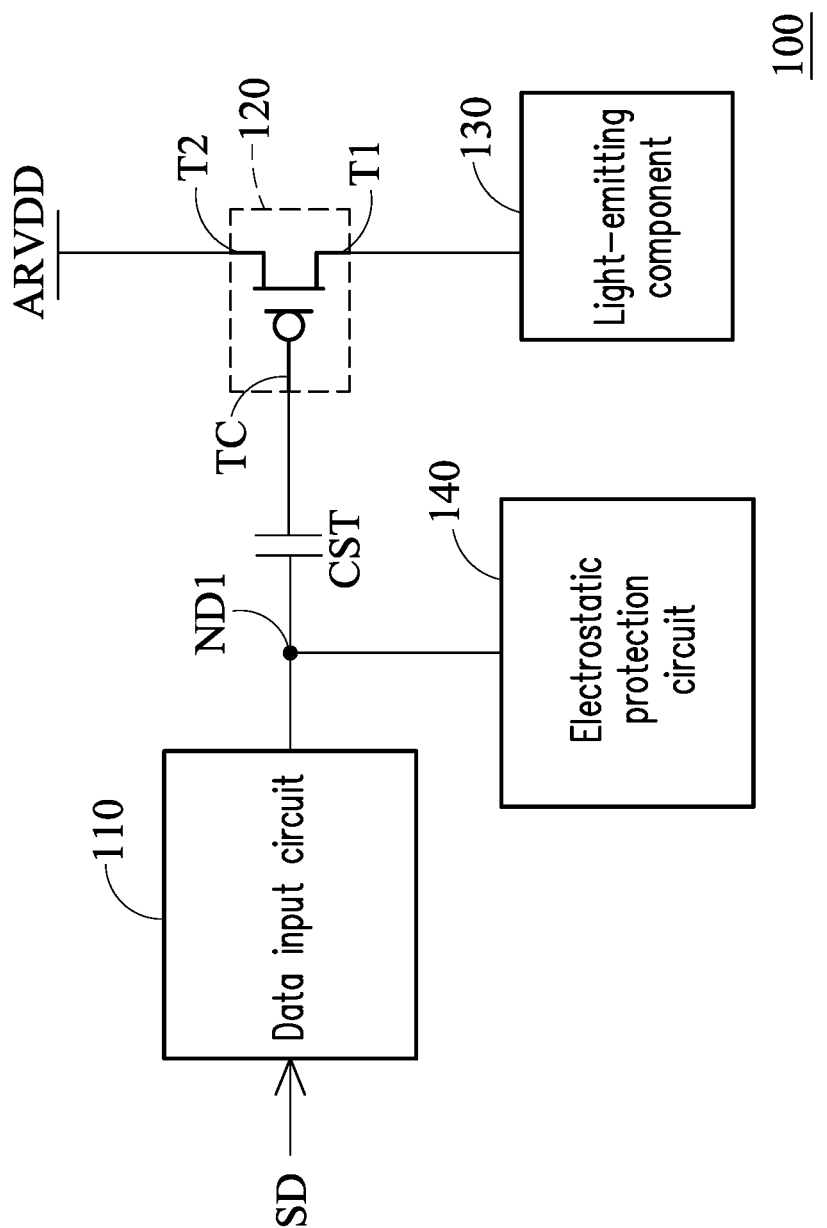
FIG. 1 is a schematic diagram of a light-emitting device according to a first embodiment of the disclosure.

The disclosure may be understood with reference to the following detailed description taken in conjunction with the drawings as described below. It should be noted that for the purpose of clarity and ease of understanding by the reader, various drawings of the disclosure depict a part of an electronic device, and certain components in the various drawings may not be drawn to scale. Furthermore, the number and the size of each device shown in the drawings are illustrative only and are not intended to limit the scope of the disclosure.

Certain terms are used throughout the description and the following claims to refer to specific components. As understood by persons skilled in the art, electronic apparatus manufacturers may refer to the components by different names. The disclosure does not intend to distinguish between the components that differ by name but not function. In the following description and in the claims, the terms "comprising", "including", and "having" are used in an open-ended manner and should therefore be interpreted to mean "comprising but not limited to . . . ". Therefore, when the terms "comprising", "including", and/or "having" are used in the description of the disclosure, the same indicates the presence of a corresponding feature, region, step, operation, and/or component, but is not limited to the presence of one or more corresponding features, regions, steps, operations, and/or components.

It should be understood that when a component is referred to as being "coupled to", "connected to", or "conducted to" another component, the component may be directly connected to the other component and may directly establish electrical connection or there may be an intermediate component between the components for relaying electrical connection (indirect electrical connection). In contrast, when a component is referred to as being "directly coupled to", "directly conducted to", or "directly connected to" another component, there is no intermediate component present.

Although terms such as first, second, and third may be used to describe different constituent components, such constituent components are not limited by the terms. The terms are only used to distinguish a constituent component from other constituent components in the specification. The claims may not use the same terms, but may use the terms first, second, third, etc. with respect to the required order of the components. Therefore, in the following description, a first constituent component may be a second constituent component in the claims.

An electronic device of the disclosure may include a display apparatus, an antenna device, a sensing device, a light-emitting device, a touch display device, a curved display device, a vehicle screen device, or a free shape electronic device, but not limited thereto. The electronic device may include a bendable or flexible electronic device. The electronic device may include, for example, liquid crystal, a light-emitting diode, quantum dot (QD), fluorescence, phosphor, other suitable display media, or a combination of the above materials, but not limited thereto. The light-emitting diode may include, for example, an organic light-emitting diode (OLED), a mini LED, a micro LED, a quantum dot LED (QLED or QDLED), other suitable materials, or a combination of the above, but not limited thereto. The display apparatus may include, for example, a splicing display apparatus, but not limited to. The antenna device may be, for example, a liquid crystal antenna, but not limited thereto. The antenna device may include, for example, an antenna splicing device, but not limited to. It should be noted that the electronic device may be any arrangement combination of the above, but not limited thereto. In addition, the appearance of the electronic device may be rectangular, circular, polygonal, a shape having curved edges, or other suitable shapes. The electronic device may have a peripheral system such as a driving system, a control system, and a light source system to support the display apparatus, the antenna device, or the splicing device, but the disclosure is not limited thereto. The sensing device may include a camera, an infrared sensor, a fingerprint sensor, etc., and the disclosure is not limited thereto. In some embodiments, the sensing device may further include a flash light, an infrared (IR) light source, other sensors, an electronic component, or a combination of the above, but not limited thereto.

In the disclosure, embodiments use a "pixel" or "pixel unit" to describe a unit including a specific region of at least one functional circuit for at least one specific function. The region of the "pixel" depends on the unit for providing the specific function, and adjacent pixels may share the same part or wire, but may also include their own specific parts. For example, the adjacent pixels may share the same scan line or the same data line, but the pixels may also have their own transistors or capacitors.

It should be noted that technical features in different embodiments described below may be replaced, recombined, or mixed with each other to constitute another embodiment without departing from the spirit of the disclosure.

Please refer to FIG. 1. FIG. 1 is a schematic diagram of a light-emitting device according to an embodiment of the disclosure. In the embodiment, a light-emitting device 100 may be a display apparatus, a light source, or a pixel circuit. The light-emitting device 100 includes a data input circuit 110, a driving transistor 120, a light-emitting component 130, a storage capacitor CST, and an electrostatic protection circuit 140. The light-emitting component 130 is coupled to a first terminal T1 of the driving transistor 120. The storage capacitor CST is coupled between the data input circuit 110 and a control terminal TC of the driving transistor 120. In the embodiment, a second terminal T2 of the driving transistor 120 receives a power supply. Taking the embodiment as an example, the second terminal T2 of the driving transistor 120 receives a high reference voltage ARVDD (the disclosure is not limited thereto). The light-emitting device 100 uses the data input circuit 110 to receive a data signal SD, and uses the data signal SD and the capacitive coupling of the storage capacitor CST to control the turning on or off of the driving transistor 120. For example, when the driving transistor 120 is turned on, the light-emitting component 130 provides an output light (for example, a visible light or an invisible light) according to the electrical energy (current or voltage) of the high reference voltage ARVDD received. When the driving transistor 120 is turned off, the light-emitting component 130 does not provide the output light.

In the embodiment, the electrostatic protection circuit 140 is coupled to a node ND1 between the data input circuit 110 and the storage capacitor CST. The electrostatic protection circuit 140 reduces electrostatic discharge (ESD) generated by the storage capacitor CST, which reduces the risk of damage to transistors adjacent to the storage capacitor CST by the electrostatic discharge. In this way, the electrostatic protection circuit 140 can prevent the case where the light-emitting device 100 is damaged by static electricity during the manufacturing process, and reduce the hump effect occurring in the transistors adjacent to the storage capacitor CST. The light-emitting device 100 can maintain good brightness uniformity and stability.

In the embodiment, the driving transistor 120 is exemplified as a P-type transistor. However, the disclosure is not limited thereto. In some embodiments, the driving transistor 120 may be any form of transistor.

Figure 2:
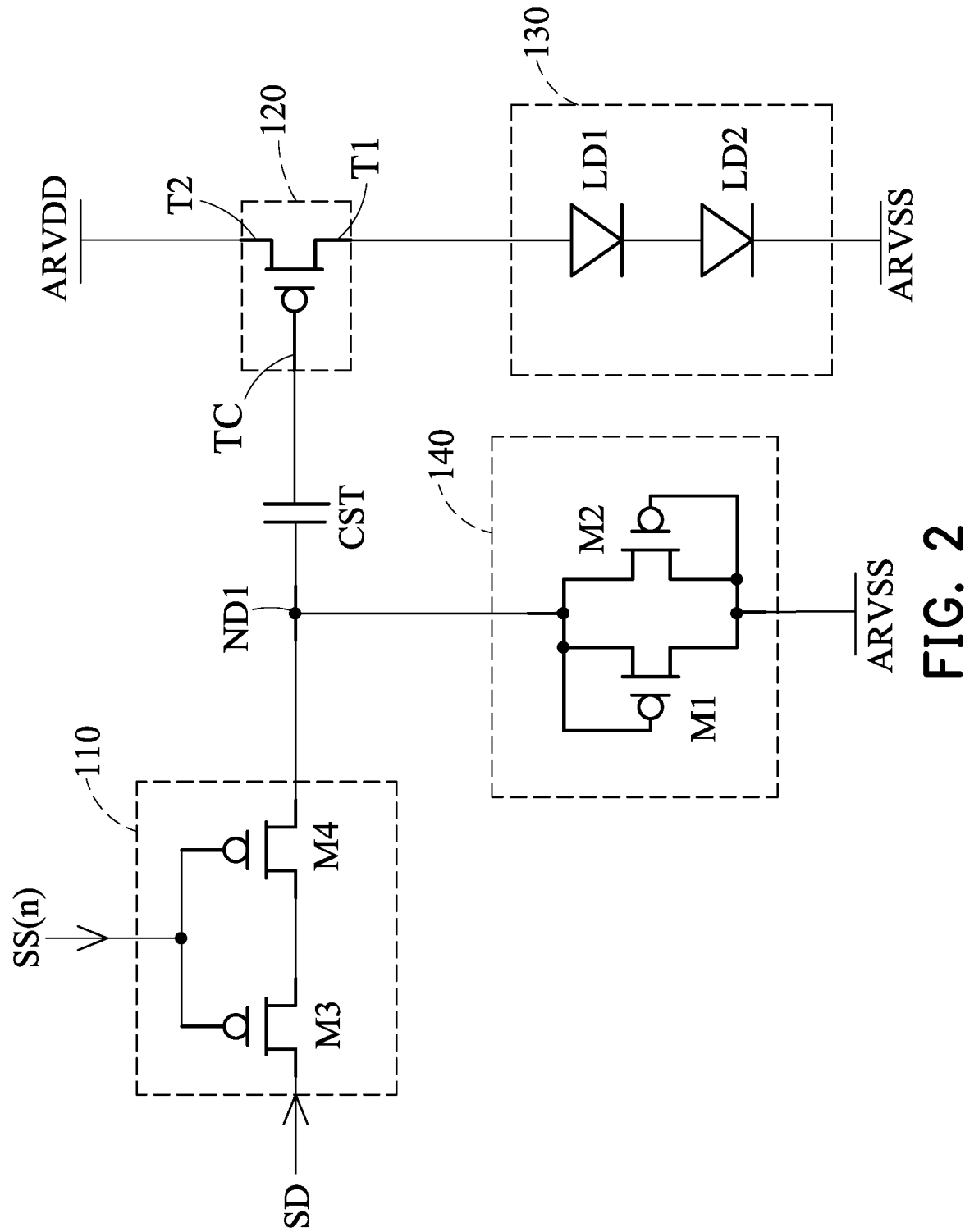
FIG. 2 is a circuit diagram of a light-emitting device according to a second embodiment of the disclosure.

Please refer to FIG. 2. FIG. 2 is a circuit diagram of a light-emitting device according to a second embodiment of the disclosure. In the embodiment, the electrostatic protection circuit 140 includes a first transistor M1 and a second transistor M2. The first transistor M1 and the second transistor M2 are coupled in parallel with each other. A control terminal of the first transistor M1 is coupled to a first terminal of the first transistor M1 and a first terminal of the second transistor M2. A control terminal of the second transistor M2 is coupled to a second terminal of the first transistor M1 and a second terminal of the second transistor M2. Further, the first transistor M1 and the second transistor M2 are, for example, P-type transistors (the disclosure is not limited thereto). Taking the embodiment as an example, the first terminal of the first transistor M1 is a source. The second terminal of the first transistor M1 is a drain. The control terminal of the first transistor M1 is a gate. Similarly, the first terminal of the second transistor M2 is a source. The second terminal of the second transistor M2 is a drain. The control terminal of the second transistor M2 is a gate. The first terminal of the first transistor M1 and the first terminal of the second transistor M2 are coupled to the node ND1 between the data input circuit 110 and the storage capacitor CST. The second terminal of the first transistor M1 and the second terminal of the second transistor M2 are coupled to a low reference voltage ARVSS.

In the embodiment, the data input circuit 110 includes data input transistors M3 and M4. A first terminal of the data input transistor M3 receives the data signal SD. A control terminal of the data input transistor M3 receives a scan signal SS(n). A first terminal of the data input transistor M4 is coupled to a second terminal of the data input transistor M3. A second terminal of the data input transistor M4 is coupled to the electrostatic protection circuit 140. A control terminal of the data input transistor M4 receives the scan signal SS(n). The data input transistors M3 and M4 transmit the data signal SD to the node ND1 according to the scan signal SS(n).

In the embodiment, the electrostatic protection circuit 140 is coupled between the node ND1 and the low reference voltage ARVSS. The electrostatic protection circuit 140 can discharge the electrostatic discharge generated by the storage capacitor CST at the node ND1 to the low reference voltage ARVSS. In this way, the electrostatic protection circuit 140 can reduce the risk of the data input transistors M3 and M4 being damaged by the electrostatic discharge.

In the embodiment, the first transistor M1 has a first channel length. The second transistor M2 has a second channel length. The first channel length of the first transistor M1 and the second channel length of the second transistor M2 are designed to be greater than or equal to m. The above design ensures that the electrostatic protection circuit 140 can stably discharge the electrostatic discharge.

In some embodiments, the data input circuit 110 may include the data input transistor M3. The first terminal of the data input transistor M3 receives the data signal SD. The second terminal of the data input transistor M3 is coupled to the electrostatic protection circuit 140. The control terminal of the data input transistor M3 receives the scan signal SS(n). The disclosure does not limit the number of data input transistors.

In the embodiment, the data input transistors M3 and M4 are exemplified by P-type transistors. The disclosure does not limit the form of the data input transistors M3 and M4.

In the embodiment, the light-emitting component 130 may include light-emitting diodes LD1 and LD2 coupled in series (the disclosure is not limited thereto). The light-emitting component 130 is coupled between the first terminal T1 of the driving transistor 120 and the low reference voltage ARVSS. The number of light-emitting diodes of the light-emitting component 130 of the disclosure may be one or more and is not limited to the embodiment.

Figure 3:
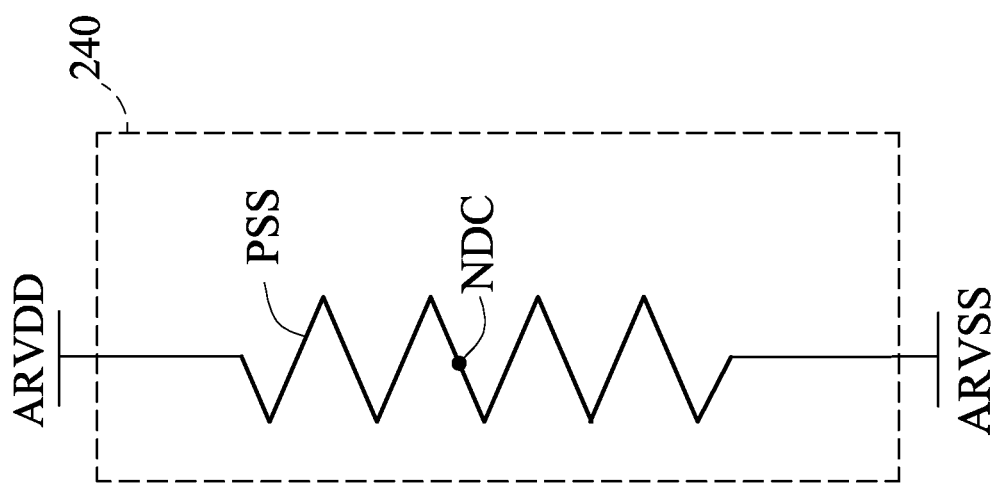
FIG. 3 is a schematic diagram of an electrostatic protection circuit according to an embodiment of the disclosure.

The electrostatic protection circuit of the disclosure may be implemented as a circuit different from the electrostatic protection circuit 140 of FIG. 2. Please refer to FIG. 1 and FIG. 3 at the same time. FIG. 3 is a schematic diagram of an electrostatic protection circuit according to an embodiment of the disclosure. An electrostatic protection circuit 240 includes a polysilicon semiconductor PSS. The polysilicon semiconductor PSS is coupled between the low reference voltage ARVSS and the high reference voltage ARVDD. The polysilicon semiconductor PSS has a connection node NDC connected to the node ND1. An impedance path of the polysilicon semiconductor PSS may be used as a discharge path of the electrostatic discharge. The electrostatic discharge may be discharged to the low reference voltage ARVSS. Therefore, the risk of damage to the transistors adjacent to the storage capacitor CST by the electrostatic discharge is reduced.

Figure 4:
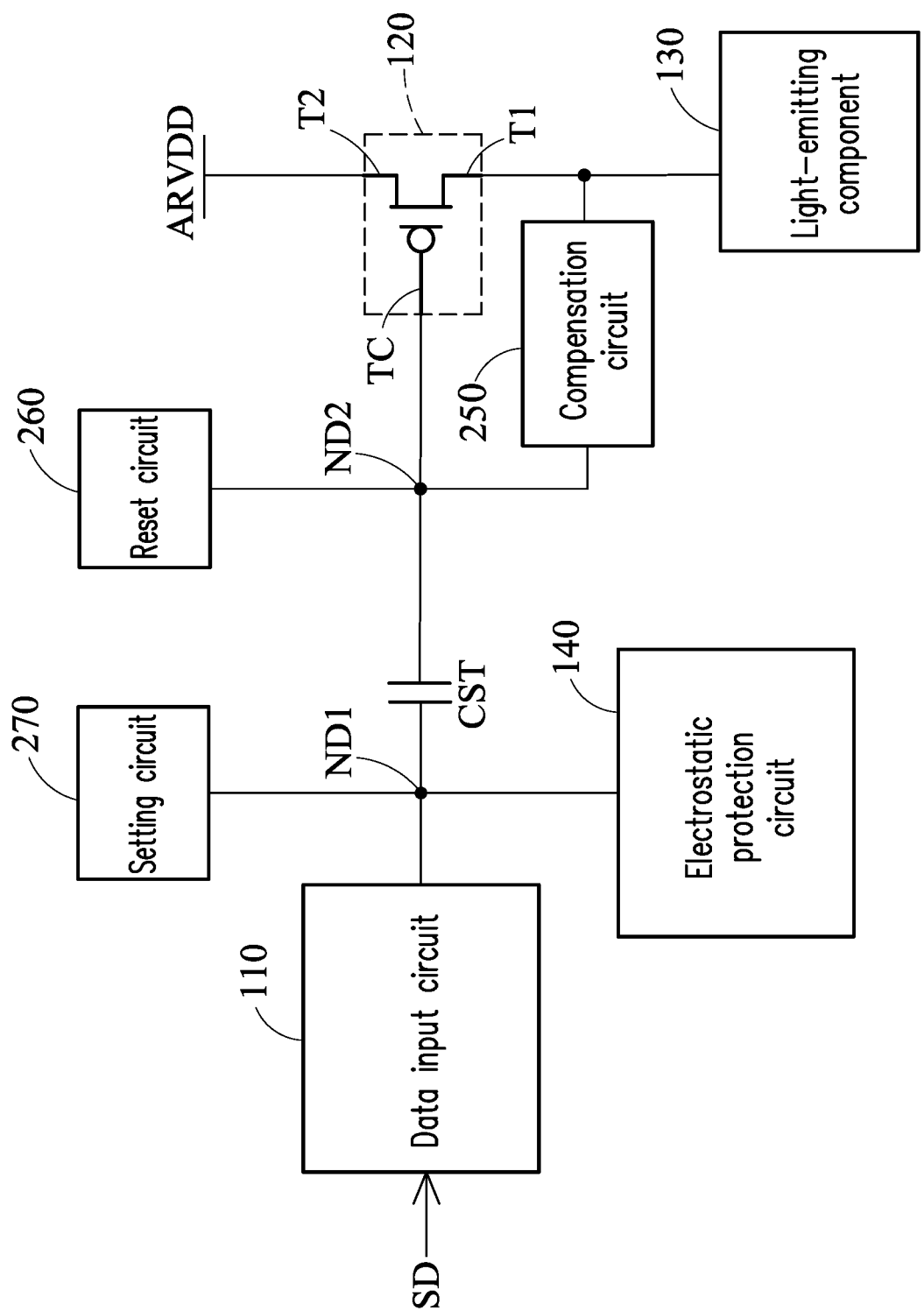
FIG. 4 is a schematic diagram of the light-emitting device according to the second embodiment of the disclosure.

Please refer to FIG. 4. FIG. 4 is a circuit diagram of the light-emitting device according to the second embodiment of the disclosure. In the embodiment, a light-emitting device 200 includes the data input circuit 110, the driving transistor 120, the light-emitting component 130, the storage capacitor CST, the electrostatic protection circuit 140, a compensation circuit 250, a reset circuit 260, and a setting circuit 270. The implementation details of the data input circuit 110, the driving transistor 120, the light-emitting component 130, the storage capacitor CST, and the electrostatic protection circuit 140 have been clearly described in the embodiments of FIG. 1, FIG. 2, and FIG. 3, so there will be no repetition. In the embodiment, the compensation circuit 250 is coupled between the control terminal TC of the driving transistor 120 and the first terminal T1 of the driving transistor 120. The reset circuit 260 is coupled to a node ND2 between the storage capacitor CST and the driving transistor 120. The setting circuit 270 is coupled to the node ND1 between the data input circuit 110 and the storage capacitor CST.

It should be noted that the data input circuit 110 and the setting circuit 270 are respectively coupled to the node ND1. Therefore, the electrostatic protection circuit 140 can reduce the risk of the transistor of the data input circuit 110 and the transistor of the setting circuit 270 being damaged by the electrostatic discharge.

In the embodiment, during a preset period, the setting circuit 270 provides a first preset voltage value to the node ND1. The reset circuit 260 provides a second preset voltage value to the node ND2. Therefore, there is a preset voltage difference value between the nodes ND1 and ND2 (that is, between the two terminals of the storage capacitor CST). During an output period after the preset period, the data input circuit 110 provides the data signal SD to the node ND1. The light-emitting device 200 uses the data signal SD and the preset voltage difference value to control the driving transistor 120, thereby driving the light-emitting component 130 to provide the output light. In addition, during the output period, the compensation circuit 250 compensates a voltage value at the control terminal TC of the driving transistor 120.

In some embodiments, at least one of the compensation circuit 250, the reset circuit 260, and the setting circuit 270 may be omitted based on actual usage requirements or different operating manners.

Figure 5:
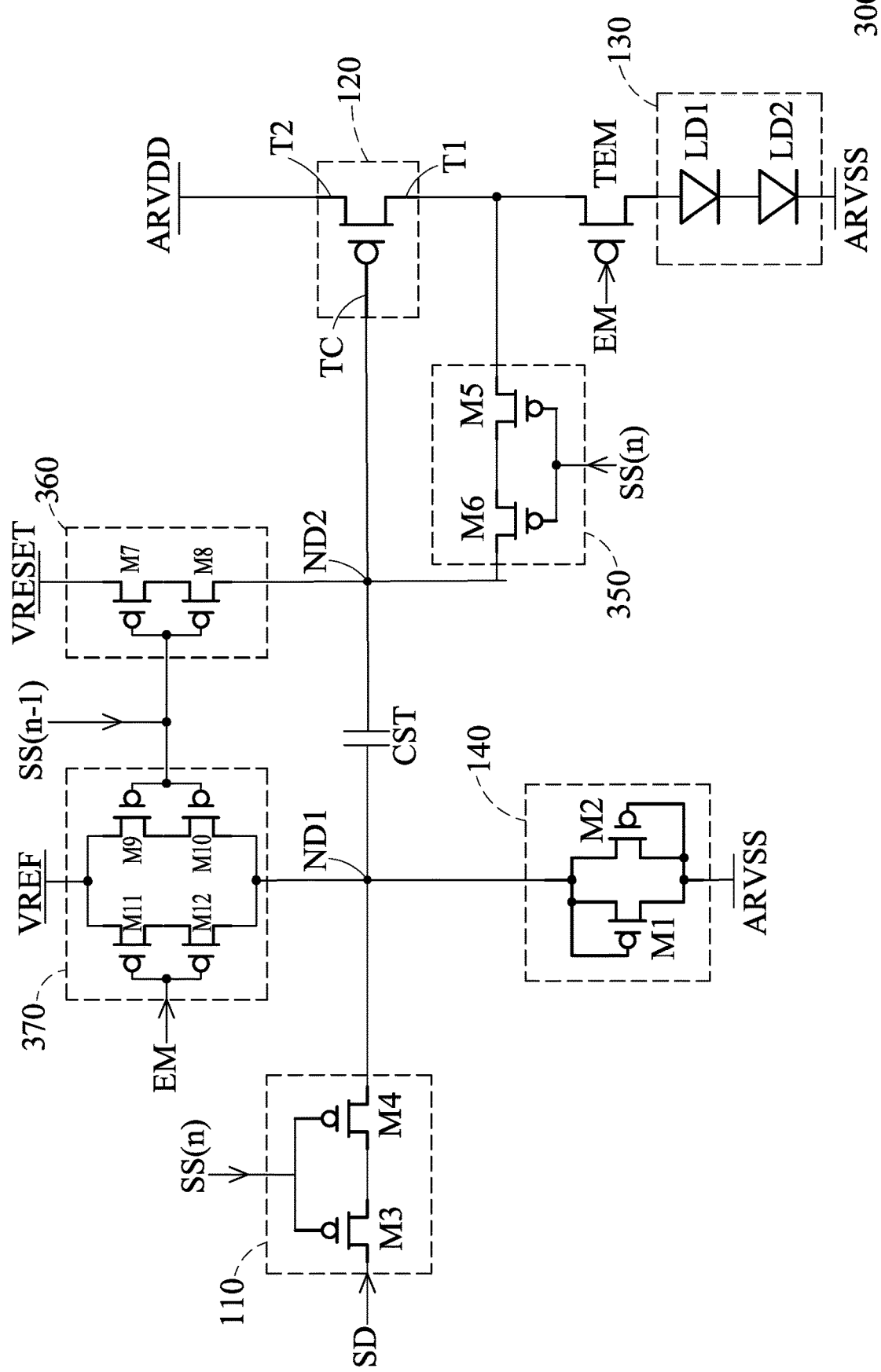
FIG. 5 is a circuit diagram of a light-emitting device according to a third embodiment of the disclosure.

Please refer to FIG. 5. FIG. 5 is a circuit diagram of a light-emitting device according to a third embodiment of the disclosure. In the embodiment, a light-emitting device 300 includes the data input circuit 110, the driving transistor 120, the light-emitting component 130, the storage capacitor CST, the electrostatic protection circuit 140, a compensation circuit 350, a reset circuit 360, a setting circuit 370, and an enabling transistor TEM. The implementation details of the data input circuit 110, the driving transistor 120, the light-emitting component 130, the storage capacitor CST, and the electrostatic protection circuit 140 have been clearly explained in the embodiments of FIG. 1, FIG. 2, and FIG. 3, so there will be no repetition. In the embodiment, the compensation circuit 350 is coupled between the control terminal TC of the driving transistor 120 and the first terminal T1 of the driving transistor 120. The compensation circuit 350 includes compensation transistors M5 and M6. A first terminal of the compensation transistor M5 is coupled to the first terminal T1 of the driving transistor 120. A control terminal of the compensation transistor M5 receives the scan signal SS(n). A first terminal of the compensation transistor M6 is coupled to a second terminal of the compensation transistor M5. A second terminal of the compensation transistor M6 is coupled to the node ND2 and the control terminal TC of the driving transistor 120. A control terminal of the compensation transistor M6 receives the scan signal SS(n).

In the embodiment, the reset circuit 360 is coupled to the node ND2 and the control terminal TC of the driving transistor 120. The reset circuit 360 includes reset transistors M7 and M8. A first terminal of the reset transistor M7 receives a reset voltage VRESET. A control terminal of the reset transistor M7 receives a scan signal SS(n−1). A first terminal of the reset transistor M8 is coupled to a second terminal of the reset transistor M7. A second terminal of the reset transistor M8 is coupled to the node ND2. A control terminal of the reset transistor M8 receives the scan signal SS(n−1). In the embodiment, the scan signal SS(n−1) is a previous-stage scan signal of the scan signal SS(n).

In the embodiment, the setting circuit 270 is coupled to the node ND1. The setting circuit 270 includes setting transistors M9 to M12. A first terminal of the setting transistor M9 receives a reference voltage VREF. A control terminal of the setting transistor M9 receives the scan signal SS(n−1). A first terminal of the setting transistor M10 is coupled to a second terminal of the setting transistor M9. A second terminal of the setting transistor M10 is coupled to the node ND1. A control terminal of the setting transistor M10 receives the scan signal SS(n−1). A first terminal of the setting transistor M11 receives the reference voltage VREF. A control terminal of the setting transistor M11 receives an enabling signal EM. A first terminal of the setting transistor M12 is coupled to a second terminal of the setting transistor M11. A second terminal of the setting transistor M12 is coupled to the node ND1. A control terminal of the setting transistor M12 receives the enabling signal EM.

It should be noted that the data input circuit 110 and the setting circuit 370 are respectively coupled to the node ND1. Therefore, the electrostatic protection circuit 140 can reduce the risk of the data input transistors M3 and M4 and the setting transistors M9 to M12 being damaged by the electrostatic discharge.

In the embodiment, a first terminal of the enabling transistor TEM is coupled to the first terminal T1 of the driving transistor 120. A second terminal of the enabling transistor TEM is coupled to the light-emitting component 130. A control terminal of the enabling transistor TEM receives the enabling signal EM.

In the embodiment, the driving transistor 120, the data input transistors M3 and M4, the compensation transistors M5 and M6, the reset transistors M7 and M8, the setting transistors M9 to M12, and the enabling transistor TEM are, for example, exemplified as P-type transistors. However, the disclosure is not limited thereto. Based on actual design requirements, at least one of the driving transistor 120, the data input transistors M3 and M4, the compensation transistors M5 and M6, the reset transistors M7 and M8, the setting transistor M9 to M12, and the enabling transistor TEM may be an N-type transistor.

Figure 6:
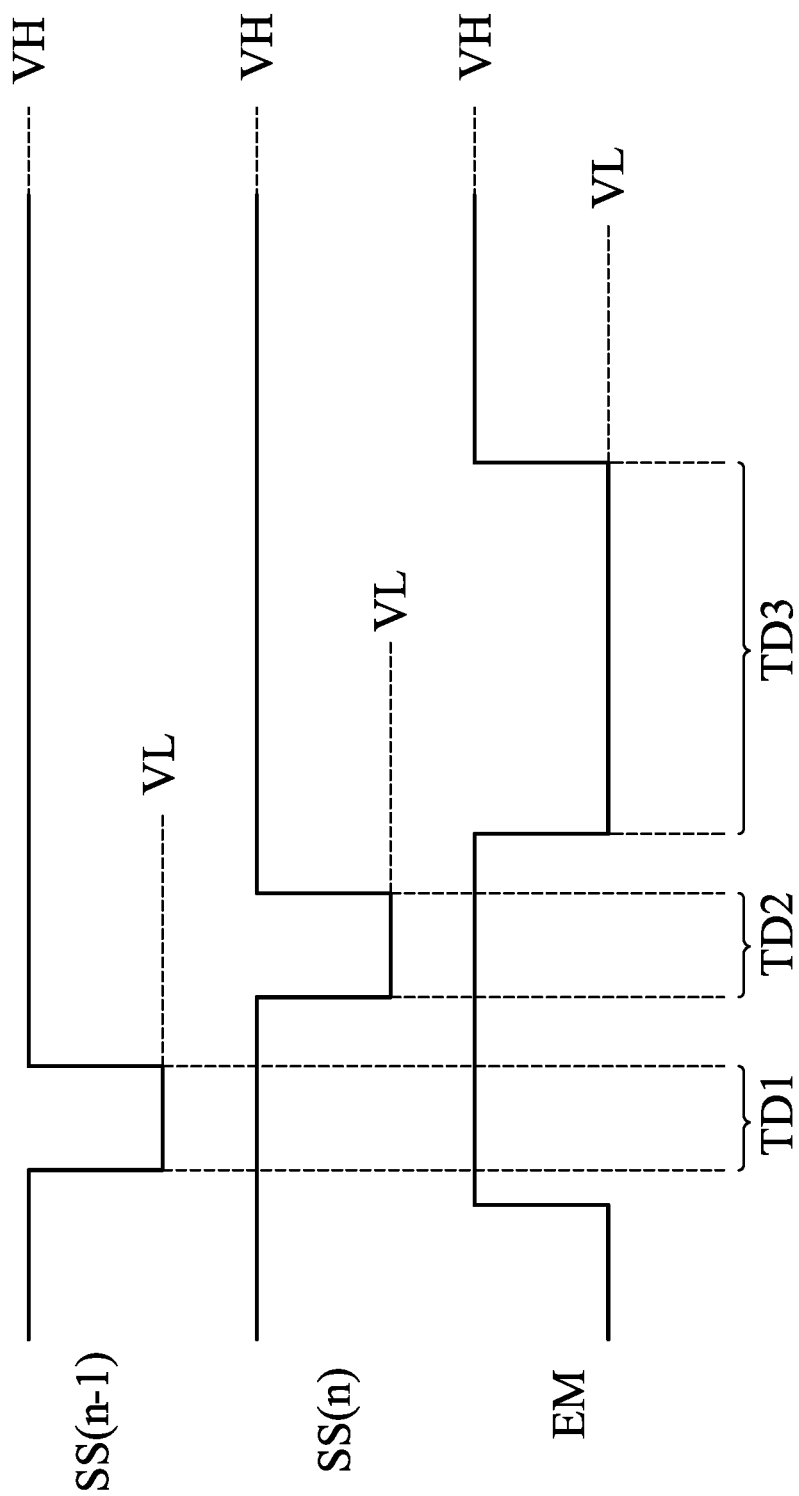
FIG. 6 is a signal timing diagram according to the third embodiment.

Please refer to FIG. 5 and FIG. 6 at the same time. FIG. 6 is a signal timing diagram according to the third embodiment. The signal timing diagram of the embodiment may be applied to the light-emitting device 300. The signal timing diagram of the embodiment shows timings of the scan signals SS(n) and SS(n−1) and the enabling signal EM.

During a preset period TD1, the scan signal SS(n−1) has a low voltage value VL. The low voltage value VL is a voltage value that is less than or equal to 0. The low voltage value VL of the embodiment is, for example, −8 volts. The reset transistors M7 and M8 and the setting transistors M9 and M10 are turned on in response to the low voltage value VL of the scan signal SS(n−1). A voltage value of the node ND1 is associated with a voltage value of the reference voltage VREF. A voltage value of the node ND2 is associated with a voltage value of the reset voltage VRESET. Therefore, there is the preset voltage difference value between the nodes ND1 and ND2 during the preset period TD1.

In addition, during the preset period TD1, the scan signal SS(n) and the enabling signal EM respectively have a high voltage value VH. The high voltage value VH is a voltage value that is greater than 0. The high voltage value VH of the embodiment is, for example, 8 volts. Therefore, the data input transistors M3 and M4, the compensation transistors M5 and M6, the setting transistors M11 and M12, and the enabling transistor TEM are turned off in response to the high voltage value VH.

During a data input period TD2, the scan signal SS(n−1) and the enabling signal EM respectively have the high voltage value VH. Therefore, the reset transistors M7 and M8, the setting transistors M9 to M12, and the enabling transistor TEM are turned off in response to the high voltage value VH.

During the data input period TD2, the scan signal SS(n) has the low voltage value VL. The data input transistors M3 and M4 and the compensation transistors M5 and M6 are turned on in response to the low voltage value VL of the scan signal SS(n). The data input circuit 110 provides the data signal SD to the node ND1. The light-emitting device 300 uses the data signal SD and the preset voltage difference value to control the driving transistor 120. A voltage value at the node ND2 is substantially equal to the sum of a voltage value of the data signal SD and the preset voltage difference value. Therefore, the voltage value at the node ND2 is substantially equal to the voltage value at the control terminal TC of the driving transistor 120.

When the voltage difference value between the second terminal T2 (that is, the source) of the driving transistor 120 and the control terminal TC (that is, the gate) of the driving transistor 120 is less than a threshold voltage value of the driving transistor 120, the driving transistor 120 is turned on. In other words, when the voltage at the node ND2 is sufficiently high, the driving transistor 120 is turned on. Therefore, the first terminal T1 of the driving transistor 120 has a high voltage value associated with the high reference voltage ARVDD. At this time, the turned-on compensation transistors M5 and M6 use the high voltage at the first terminal T1 of the driving transistor 120 to compensate the voltage at the node ND2.

On the other hand, when the voltage at the node ND2 is sufficiently low, the voltage difference value between the second terminal T2 of the driving transistor 120 and the control terminal TC of the driving transistor 120 is greater than the threshold voltage value of the driving transistor 120, and the driving transistor 120 is turned off. Therefore, the first terminal T1 of the driving transistor 120 does not have a high voltage value associated with the high reference voltage ARVDD.

During an output period TD3, the scan signals SS(n−1) and SS(n) respectively have the high voltage value VH. Therefore, the data input transistors M3 and M4, the compensation transistors M5 and M6, the reset transistors M7 and M8, and the setting transistors M9 and M10 are turned off in response to the high voltage value VH.

During the output period TD3, the enabling signal EM has the low voltage value VL. The setting transistors M11 and M12 and the enabling transistor TEM are turned on in response to the low voltage value VL of the enabling signal EM. The enabling transistor TEM transmits the electrical energy at the first terminal of the driving transistor 120 to the light-emitting component 130. During the output period TD3, the light-emitting component 130 provides the corresponding output light according to the electrical energy at the first terminal of the driving transistor 120. In addition, the turned-on setting transistors M11 and M12 can use the reference voltage VREF to precharge the node ND1 before the next preset period TD1.

In summary, the electrostatic protection circuit of the disclosure is coupled to the node between the data input circuit and the storage capacitor. The electrostatic protection circuit can prevent the light-emitting device from being damaged by the static electricity during the manufacturing process. The risk of damage to the transistors adjacent to the storage capacitor by the electrostatic discharge is reduced. In this way, the hump effect occurring in the transistors adjacent to the storage capacitor is reduced, so that the light-emitting device can maintain good brightness uniformity and stability.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments can still be modified or some or all of the technical features thereof can be equivalently replaced. However, the modifications or replacements do not cause the essence of the corresponding technical solutions to deviate from the scope of the technical solutions of the embodiments of the disclosure.

What is claimed is:

1. A light-emitting device, comprising:
   a data input circuit;
   a driving transistor, having a control terminal and a first terminal;
   a light-emitting component, coupled to the first terminal of the driving transistor;
   a storage capacitor, coupled between the data input circuit and the control terminal of the driving transistor; and
   an electrostatic protection circuit, coupled to a node between the data input circuit and the storage capacitor.

2. The light-emitting device according to claim 1, wherein the electrostatic protection circuit comprises a first transistor and a second transistor connected in parallel with each other, wherein:
   the first transistor comprises a control terminal, a first terminal, and a second terminal,
   the second transistor comprises a control terminal, a first terminal, and a second terminal,
   the control terminal of the first transistor is coupled to the first terminal of the first transistor and the first terminal of the second transistor, and
   the control terminal of the second transistor is coupled to the second terminal of the first transistor and the second terminal of the second transistor.

3. The light-emitting device according to claim 2, wherein:
   the first transistor has a first channel length,
   the first channel length is greater than or equal to 20 μm,
   the second transistor has a second channel length, and
   the second channel length is greater than or equal to 20 μm.

4. The light-emitting device according to claim 2, wherein the electrostatic protection circuit is further coupled to a low reference voltage.

5. The light-emitting device according to claim 1, wherein the electrostatic protection circuit comprises a polysilicon semiconductor.

6. The light-emitting device according to claim 5, wherein the polysilicon semiconductor is coupled between a low reference voltage and a high reference voltage.

7. The light-emitting device according to claim 6, wherein the polysilicon semiconductor has a connection node connected to the node between the data input circuit and the storage capacitor.

8. The light-emitting device according to claim 1, wherein the data input circuit comprises:
   a data input transistor, comprising a control terminal, a first terminal, and a second terminal, wherein
   the control terminal of the data input transistor is used to receive a scan signal,
   the first terminal of the data input transistor is used to receive a data signal, and
   the second terminal of the data input transistor is coupled to the electrostatic protection circuit.

9. The light-emitting device according to claim 1, wherein the data input circuit comprises:
   a first data input transistor, wherein a control terminal of the first data input transistor is used to receive a scan signal, and a first terminal of the first data input transistor is used to receive a data signal; and
   a second data input transistor, wherein a control terminal of the second data input transistor is used to receive the scan signal, a first terminal of the second data input transistor is coupled to a second terminal of the first data input transistor, and a second terminal of the second data input transistor is coupled to the node between the data input circuit and the storage capacitor.

10. The light-emitting device according to claim 1, further comprising:
    a compensation circuit, coupled between the control terminal of the driving transistor and the first terminal of the driving transistor.

11. The light-emitting device according to claim 10, wherein the compensation circuit compensates a voltage value at the control terminal of the driving transistor.

12. The light-emitting device according to claim 10, wherein the compensation circuit comprises:
    a first compensation transistor, wherein a first terminal of the first compensation transistor is coupled to the first terminal of the driving transistor, and a control terminal of the first compensation transistor is used to receive a scan signal; and
    a second compensation transistor, wherein a first terminal of the second compensation transistor is coupled to a second terminal of the first compensation transistor, a control terminal of the second compensation transistor is used to receive the scan signal, and a second terminal of the second compensation transistor is coupled to the control terminal of the driving transistor.

13. The light-emitting device according to claim 1, further comprising:
    a reset circuit, coupled to a node between the storage capacitor and the driving transistor.

14. The light-emitting device according to claim 13, wherein the reset circuit presets the node between the storage capacitor and the driving transistor according to a previous-stage scan signal having a low voltage value during a preset period.

15. The light-emitting device according to claim 13, wherein the reset circuit comprises:
    a first reset transistor, wherein a first terminal of the first reset transistor is used to receive a reset voltage, and a control terminal of the first reset transistor is used to receive a previous-stage scan signal; and
    a second reset transistor, wherein a first terminal of the second reset transistor is coupled to a second terminal of the first reset transistor, a second terminal of the second reset transistor is coupled to the node between the storage capacitor and the driving transistor, and a control terminal of the second reset transistor is used to receive the previous-stage scan signal.

16. The light-emitting device according to claim 13, wherein during a preset period, there is a preset voltage difference value between two terminals of the storage capacitor.

17. The light-emitting device according to claim 1, further comprising:
    a setting circuit, coupled to the node between the data input circuit and the storage capacitor.

18. The light-emitting device according to claim 17, wherein the setting circuit presets the node between the data input circuit and the storage capacitor according to a previous-stage scan signal having a low voltage value during a preset period.

19. The light-emitting device according to claim 17, wherein the setting circuit comprises:
    a first setting transistor, wherein a first terminal of the first setting transistor is used to receive a reference voltage, and a control terminal of the first setting transistor is used to receive a previous-stage scan signal; and a second setting transistor, wherein a first terminal of the second setting transistor is coupled to a second terminal of the first setting transistor, a second terminal of the second setting transistor is coupled to the node between the data input circuit and the storage capacitor, and a control terminal of the second setting transistor is used to receive the previous-stage scan signal.

20. The light-emitting device according to claim 19, wherein the setting circuit further comprises:

a third setting transistor, wherein a first terminal of the third setting transistor is used to receive the reference voltage, and a control terminal of the third setting transistor is used to receive an enabling signal; and a fourth setting transistor, wherein a first terminal of the fourth setting transistor is coupled to a second terminal of the third setting transistor, a second terminal of the fourth setting transistor is coupled to the node between the data input circuit and the storage capacitor, and a control terminal of the fourth setting transistor is used to receive the enabling signal.

* * * * *